(12) United States Patent
Fujikawa

(10) Patent No.: US 11,946,156 B2
(45) Date of Patent: Apr. 2, 2024

(54) SIC SINGLE CRYSTAL GROWTH CRUCIBLE, SIC SINGLE CRYSTAL MANUFACTURING METHOD, AND SIC SINGLE CRYSTAL MANUFACTURING APPARATUS

(71) Applicant: SHOWA DENKO K.K., Tokyo (JP)

(72) Inventor: Yohei Fujikawa, Hikone (JP)

(73) Assignee: Resonac Corporation, Tokyo (JP)

( * ) Notice: Subject to any disclaimer, the term of this patent is extended or adjusted under 35 U.S.C. 154(b) by 390 days.

(21) Appl. No.: 16/734,966

(22) Filed: Jan. 6, 2020

(65) Prior Publication Data

US 2020/0224328 A1    Jul. 16, 2020

(30) Foreign Application Priority Data

Jan. 10, 2019    (JP) .................... 2019-002576

(51) Int. Cl.
| | |
|---|---|
| C30B 23/06 | (2006.01) |
| C23C 14/06 | (2006.01) |
| C23C 14/24 | (2006.01) |
| C30B 29/36 | (2006.01) |
| C30B 35/00 | (2006.01) |

(52) U.S. Cl.
CPC ........ *C30B 23/066* (2013.01); *C23C 14/0635* (2013.01); *C23C 14/243* (2013.01); *C30B 29/36* (2013.01); *C30B 35/002* (2013.01)

(58) Field of Classification Search
CPC . C23C 14/0635; C23C 14/243; C30B 23/066; C30B 29/36; C30B 35/002
See application file for complete search history.

(56) References Cited

U.S. PATENT DOCUMENTS

2015/0225873 A1*  8/2015  Fujiwara ........... H01L 21/02645
                                                              117/84

FOREIGN PATENT DOCUMENTS

| CN | 1603475 | A |   | 4/2005 |
|---|---|---|---|---|
| CN | 1876899 | A |   | 12/2006 |
| CN | 105102648 | A |   | 11/2015 |
| CN | 205603723 | U | * | 9/2016 |
| CN | 205603723 | U |   | 9/2016 |
| CN | 206418222 | U |   | 8/2017 |
| GB | 816334 | A |   | 7/1959 |
| JP | 5-058774 | A |   | 3/1993 |
| JP | 06191998 | A | * | 7/1994 |
| JP | 2001226199 | A | * | 8/2001 |
| JP | 2003036890 | A | * | 2/2003 |

(Continued)

OTHER PUBLICATIONS

Communication dated Apr. 22, 2021 by The State Intellectual Property Office of the People's Republic of China in application No. 202010019974.X.

(Continued)

*Primary Examiner* — Hua Qi
(74) *Attorney, Agent, or Firm* — Sughrue Mion, PLLC

(57) ABSTRACT

According to the invention, a SiC single crystal growth crucible includes: a raw material accommodation portion which accommodates a SiC raw material; and a seed crystal support portion which supports a seed crystal disposed on an upper portion of the raw material accommodation portion, in which the raw material accommodation portion has a tapered portion, an inner surface of which is tapered off downward.

6 Claims, 5 Drawing Sheets

(56) References Cited

FOREIGN PATENT DOCUMENTS

| JP | 2007-230846 A | | 9/2007 |
|---|---|---|---|
| JP | 2007230846 A | * | 9/2007 |
| JP | 2012171812 A | * | 9/2012 |
| JP | 2016-34880 A | | 3/2016 |
| KR | 20120135743 A | * | 12/2012 |

OTHER PUBLICATIONS

Office Action dated Dec. 8, 2021 from the China National Intellectual Property Administration in CN Application No. 202010019974.X.

* cited by examiner

SIC SINGLE CRYSTAL GROWTH CRUCIBLE, SIC SINGLE CRYSTAL MANUFACTURING METHOD, AND SIC SINGLE CRYSTAL MANUFACTURING APPARATUS

BACKGROUND OF THE INVENTION

Field of the Invention

The present invention relates to a SiC single crystal growth crucible, a SiC single crystal manufacturing method, and a SiC single crystal manufacturing apparatus using this.

Priority is claimed based on Japanese Patent Application No. 2019-002576, filed Jan. 10, 2019, the content of which is incorporated herein by reference.

DESCRIPTION OF RELATED ART

A breakdown field of silicon carbide (SiC) is larger by one digit and a band gap thereof is three times larger than those of silicon (Si). In addition, SiC has characteristics in which a thermal conductivity is approximately three times higher than that of Si. Accordingly, the application of SiC to a power device, a high-frequency device, and a high-temperature operating device is expected.

As one method of manufacturing the SiC single crystal, a sublimation method is widely known. The sublimation method is a method of heating a SiC raw material to a high temperature to generate a sublimation gas in a crystal crucible, and re-crystallizing the sublimation gas on a seed crystal formed of a SiC single crystal at a comparatively low temperature to grow the SiC single crystal. In the manufacturing of the SiC single crystal using this sublimation method, a large diameter and a long growth length of the SiC single crystal are required, and it is necessary to increase a size of a crucible.

In the sublimation method, the crucible is normally heated from outside. Accordingly, the inner portion of the crucible tends to have a temperature distribution in which a temperature on the wall side is high and a temperature of the center is low. In the crucible having such a temperature distribution, a sublimation gas generated in the vicinity of the wall side of the crucible is cooled in the center of the crucible to precipitate SiC, and SiC raw material cannot be efficiently used. Particularly, in a large-sized crucible, a difference in temperature between the side wall and the center easily increases, and accordingly, the precipitation of SiC in the center easily occurs. A state of the SiC precipitated in the crucible is different from the state of the original SiC raw material, and SiC in this state cannot be re-used as the SiC raw material. Therefore, it is desired to obtain a crucible in which the precipitation of SiC in the crucible is prevented and the SiC raw material can be efficiently used.

Japanese Unexamined Patent Application, First Publication No. H5-58774 discloses a SiC single crystal growth crucible in which a thermal conductor is installed in the center of a bottom portion in the crucible, in order to evenly and stably sublimate the SiC raw material in the crucible.

SUMMARY OF THE INVENTION

However, in the SiC single crystal growth crucible disclosed in Japanese Unexamined Patent Application, First Publication No. H5-58774, the thermal conductor is installed in the crucible, the amount of the SiC raw material to be contained in the crucible is decreased, and the growth amount of the SiC single crystal is hardly increased. That is, in the SiC single crystal growth crucible disclosed in Japanese Unexamined Patent Application, First Publication No. H5-58774, it is difficult to manufacture a SiC single crystal having a large diameter and a long growth length.

The invention is made in view of such circumstances, and an object thereof is to provide a SiC single crystal growth crucible in which the precipitation of SiC in the crucible hardly occurs, even with a large size capable of manufacturing the SiC single crystal having a large diameter and a long growth length, and the SiC raw material can be efficiently used, and a SiC single crystal manufacturing method and a SiC single crystal manufacturing apparatus using this.

As a result of intensive studies, the inventors have found that, by providing a tapered portion, an inner surface of which is tapered off downward, in a raw material accommodation portion accommodating a SiC raw material of a crucible, and heating the raw material accommodation portion so that a heating center is in a range of the tapered portion, it is possible to increase a temperature of the center of the SiC raw material filled in the raw material accommodation portion, even with a large size capable of manufacturing the SiC single crystal having a large diameter and a long growth length, and therefore, the precipitation of SiC in the center of the raw material accommodation portion hardly occurs and the SiC raw material can be efficiently used.

That is, the invention provides following means, in order to solve the object described above.

(1) A SiC single crystal growth crucible according to one aspect of the invention includes: a raw material accommodation portion which accommodates a SiC raw material; and a seed crystal support portion which supports a seed crystal disposed on an upper portion of the raw material accommodation portion, in which the raw material accommodation portion has a tapered portion, an inner surface of which is tapered off downward.

(2) In the SiC single crystal growth crucible according to (1) described above, the tapered portion of the raw material accommodation portion may be continuously tapered off.

(3) In the SiC single crystal growth crucible according to (1) or (2) described above, the tapered portion of the raw material accommodation portion may be linearly tapered off.

(4) In the SiC single crystal growth crucible according to any one of (1) to (3) described above, an outer surface of the tapered portion of the raw material accommodation portion may be tapered off.

(5) A SiC single crystal manufacturing method according to another aspect of the invention is a method of manufacturing a SiC single crystal using the SiC single crystal growth crucible according to the aspect described above, and includes: a step of filling the raw material accommodation portion of the SiC single crystal growth crucible with the SiC raw material; and a step of heating the raw material accommodation portion such that a heating center is positioned in a range of the tapered portion of the raw material accommodation portion.

(6) A SiC single crystal manufacturing apparatus according to still another aspect of the invention includes: a SiC single crystal growth crucible; and a heating device which heats the SiC single crystal growth crucible, in which the SiC single crystal growth crucible is the SiC single crystal growth crucible according to the aspect described above, and the heating device is disposed such that a heating center is positioned in a range of the tapered portion of the raw material accommodation portion.

According to the invention, it is possible to provide a SiC single crystal growth crucible in which the precipitation of SiC in the crucible hardly occurs, even with a large size capable of manufacturing the SiC single crystal having a large diameter and a long growth length, and the SiC raw material can be efficiently used, and a SiC single crystal manufacturing method and a SiC single crystal manufacturing apparatus using this.

DETAILED DESCRIPTION OF THE INVENTION

Hereinafter, a SiC single crystal growth crucible, a SiC single crystal manufacturing method, and a SiC single crystal manufacturing apparatus according to the embodiment will be described in detail suitably with reference to the drawings.

The drawings used in the following description may be shown with enlarged main parts for convenience's sake, and dimensional ratios and the like of each constituent element may be different from actual values. The material, the dimension, and the like shown in the following description are merely examples, and the invention is not limited thereto and can be performed by suitably changing these in a range not changing the gist thereof.

(SiC Single Crystal Growth Crucible of Related Art)

Figure 1:
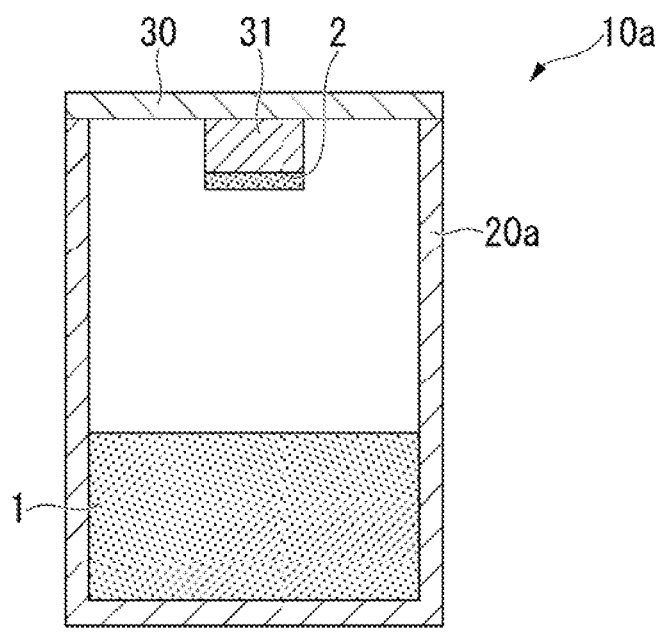
FIG. 1 is a schematic cross-sectional view showing a SiC single crystal growth crucible of the related art.

FIG. 1 is a schematic cross-sectional view showing a SiC single crystal growth crucible of the related art.

As shown in FIG. 1, a SiC single crystal growth crucible 10a includes a raw material accommodation portion 20a which accommodates a SiC raw material 1, and a lid portion 30 which is disposed on an upper portion of the raw material accommodation portion 20a. The raw material accommodation portion 20a is a bottomed cylindrical body. The lid portion 30 includes a seed crystal support portion 31 which supports a seed crystal 2.

In the sublimation method, in the SiC single crystal growth crucible 10a, the SiC raw material 1 is heated to a high temperature to generate a sublimation gas, and the sublimation gas thereof is re-crystallized on the seed crystal 2 at a relatively low temperature, to grow the seed crystal 2. The heating of the SiC raw material 1 is normally performed by heating the SiC single crystal growth crucible 10a from the outside. Accordingly, the inner portion of the SiC single crystal growth crucible 10a tends to have a temperature distribution in which a temperature of the raw material accommodation portion 20a in the vicinity of the wall side is high and a temperature thereof in the center is low. In the SiC single crystal growth crucible 10a having such a temperature distribution, a sublimation gas generated in the vicinity of the wall side of the raw material accommodation portion 20a is cooled in the center of the raw material accommodation portion 20a to precipitate SiC, and SiC raw material 1 cannot be efficiently used.

(SiC Single Crystal Growth Crucible of Embodiment)

Figure 2:
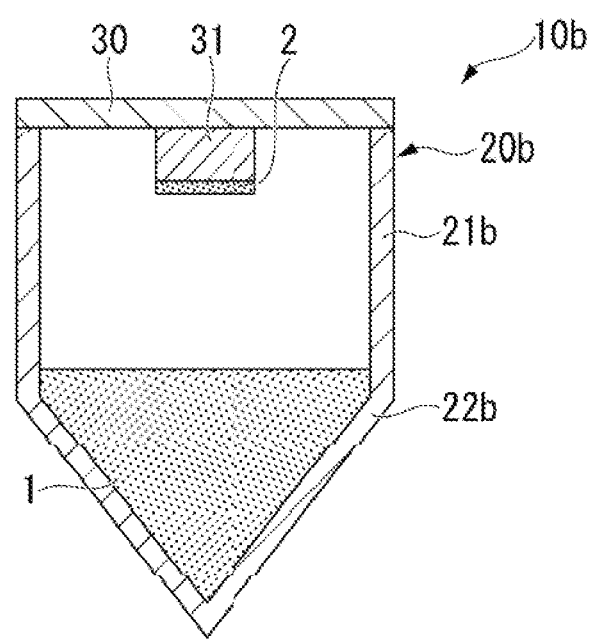
FIG. 2 is a schematic cross-sectional view showing an example of a SiC single crystal growth crucible according to one embodiment of the invention.

FIG. 2 is a schematic cross-sectional view showing an example of the SiC single crystal growth crucible according to one embodiment of the invention.

A SiC single crystal growth crucible 10b of the embodiment shown in FIG. 2 is different from the SiC single crystal growth crucible 10a of the related art, in that a raw material accommodation portion 20b includes a body portion 21b, and a tapered portion 22b, an inner surface of which is tapered off downward. An inner surface of the body portion 21b has a constant width. The same reference numerals are used for the common portions between the SiC single crystal growth crucible 10b of the embodiment and the SiC single crystal growth crucible 10a of the related art, and the description thereof will be omitted.

In the SiC single crystal growth crucible 10b of the embodiment, the body portion 21b of the raw material accommodation portion 20b has a cylindrical shape. However, the shape of the body portion 21b is not limited to the cylindrical shape. The body portion 21b may have a square cylindrical shape.

The tapered portion 22b of the raw material accommodation portion 20b has a conical shape which is continuously and linearly tapered off. However, the shape of the tapered portion 22b is not limited to the conical shape. The tapered portion 22b may be tapered off in a stepwise manner, or may have a shape which is curved inward or outward of the raw material accommodation portion 20b. For example, the tapered portion 22b may be a truncated conical shape or a semi-spherical shape. In addition, regarding the tapered portion 22b, an inner surface and an outer surface is tapered off, and only the inner surface may be tapered off. A support portion for causing self-standing of the SiC single crystal growth crucible 10b may be provided on the tapered portion 22b. The support portion may be integrally connected to the tapered portion 22b or may be detachably provided.

As a material of the raw material accommodation portion 20b and the lid portion 30, for example, a well-known heat resistant material used as a material of the SiC single crystal growth crucible such as graphite or tantalum carbide can be used.

(SiC Single Crystal Manufacturing Apparatus)

Figure 3:
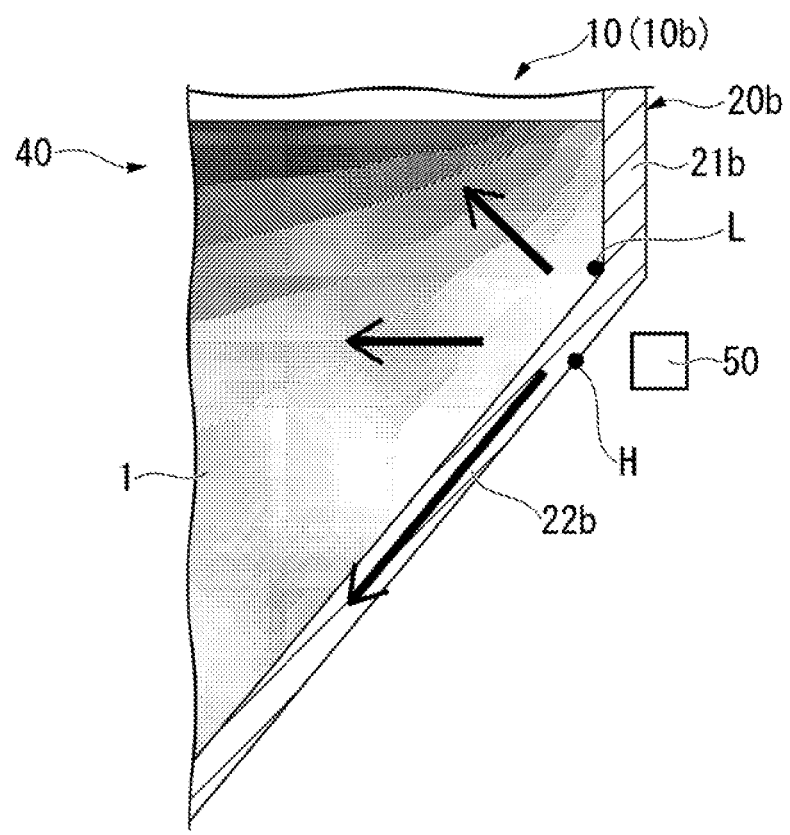
FIG. 3 is a schematic partially enlarged cross-sectional view showing an example of a SiC single crystal manufacturing apparatus using the SiC single crystal growth crucible of FIG. 2.

FIG. 3 is a schematic partially enlarged cross-sectional view showing an example of a SiC single crystal manufacturing apparatus according to the embodiment of the invention.

A SiC single crystal manufacturing apparatus 40 shown in FIG. 3 includes a SiC single crystal growth crucible 10, and a heating device 50. The SiC single crystal growth crucible 10 is the SiC single crystal growth crucible 10b shown in FIG. 2. An arrow in FIG. 3 shows a flow of heat. In addition, the gradation of the SiC raw material 1 represents a temperature distribution. The light portion indicates a high temperature and the dark portion indicates a low temperature.

The heating device 50 is disposed such that a heating center H is positioned in a range of the tapered portion 22b of the raw material accommodation portion 20b. The heating center means a portion of an outer surface of the raw material accommodation portion 20b of the SiC single crystal growth crucible 10, where the temperature is the highest, in a case of being heated by the heating device 50. That is, the heating center is a portion of the outer surface of the raw material accommodation portion 20b where the quantity of heat transmitted from the heating device 50 is the greatest. In a case where the heating device 50 is a coil type induction heating device, the heating center is normally a portion in contact with the center of a coil portion of the coil type induction heating device. In a case where the heating device 50 is a resistance heating device, the heating center is normally a portion closest to the resistance heating device. Heat is easily transmitted to the entire tapered portion 22b, by positioning the heating center H in a range of the tapered portion 22b, that is, by setting a taper start position L, where the tapered portion 22b starts, to be equal to or higher than 0 mm than the heating center H. Accordingly, the heating is evenly performed to the SiC raw material 1 on the bottom portion side of the tapered portion 22b, the uniformity of the temperature distribution of the SiC raw material 1 filled in the raw material accommodation portion 20b increases. However, in a case where a distance between the taper start position L and the heating center H of the tapered portion 22b is excessively long, the amount of the SiC raw material 1 filled in the raw material accommodation portion 20b may decrease, and heat may not be sufficiently transmitted to the bottom portion side of the tapered portion 22b. Therefore, a height of the taper start position L of the tapered portion 22b with respect to the heating center H is preferably equal to or smaller than 60 mm, more preferably equal to or smaller than 40 mm, and particularly preferably equal to or smaller than 20 mm.

The amount of the SiC raw material 1 filled in the raw material accommodation portion 20b is preferably an amount so that the height of the taper start position L of the tapered portion 22b with respect to the heating center H is within ±20% with respect to a filling height of the SiC raw material 1. The filling height of the SiC raw material 1 is a height of the SiC raw material 1 in a central axis of the raw material accommodation portion 20b. By setting the amount of the filled SiC raw material 1 in the range described above, a uniform temperature environment can be set to the center of the raw material, without excessively decreasing the amount of the filled raw material.

As the heating device 50, a well-known heating device used as a heating device for the SiC single crystal manufacturing apparatus such as a resistance heating device or an induction heating device can be used. In a case of using the induction heating device, the periphery of the SiC single crystal growth crucible 10 is preferably coated with a heat insulating material. The heat insulating material is not particularly limited, and a well-known heat insulating material used as a material for the SiC single crystal manufacturing apparatus such as carbon fiber felt can be used.

(SiC Single Crystal Manufacturing Method)

The SiC single crystal manufacturing method according to the embodiment of the invention is a SiC single crystal manufacturing method using the SiC single crystal growth crucible 10b of the embodiment described above, and includes a filling step of filling the raw material accommodation portion 20b with the SiC raw material 1, and a heating step of heating the raw material accommodation portion 20b so that the heating center is positioned in a range of the tapered portion 22b of the raw material accommodation portion 20b.

In the SiC single crystal growth crucible 10b of the embodiment having the configuration described above, the tapered portion 22b, the inner surface of which is tapered off downward, is provided in the raw material accommodation portion 20b filled with the SiC raw material 1, and the raw material accommodation portion 20b is heated so that the heating center H is in a range of the tapered portion 22b, and accordingly, it is possible to increase the temperature of the center of the SiC raw material 1 filled in the raw material accommodation portion 20b and to increase the uniformity of the temperature distribution, even with a large size capable of manufacturing the SiC single crystal having a large diameter and a long growth length. Therefore, according to the SiC single crystal growth crucible 10b of the embodiment, the precipitation of SiC hardly occurs in the center of the raw material accommodation portion 20b, and the SiC raw material 1 can be efficiently used.

In addition, in the SiC single crystal manufacturing apparatus 40 using the SiC single crystal growth crucible 10b of the embodiment, the heating device 50 is disposed such that the heating center H is positioned in a range of the tapered portion 22b of the raw material accommodation portion 20b. Accordingly, during the manufacturing of the SiC single crystal, it is possible to increase the temperature of the center of the SiC raw material 1 filled in the raw material accommodation portion 20b and increase the uniformity of the temperature distribution.

In addition, in the SiC single crystal manufacturing method using the SiC single crystal growth crucible 10b of the embodiment, the raw material accommodation portion 20b is heated so that the heating center H is positioned in a range of the tapered portion 22b of the raw material accommodation portion 20b. Accordingly, it is possible to increase the temperature of the center of the SiC raw material 1 filled in the raw material accommodation portion 20b and increase the uniformity of the temperature distribution.

(Modification Example)

Figure 4:
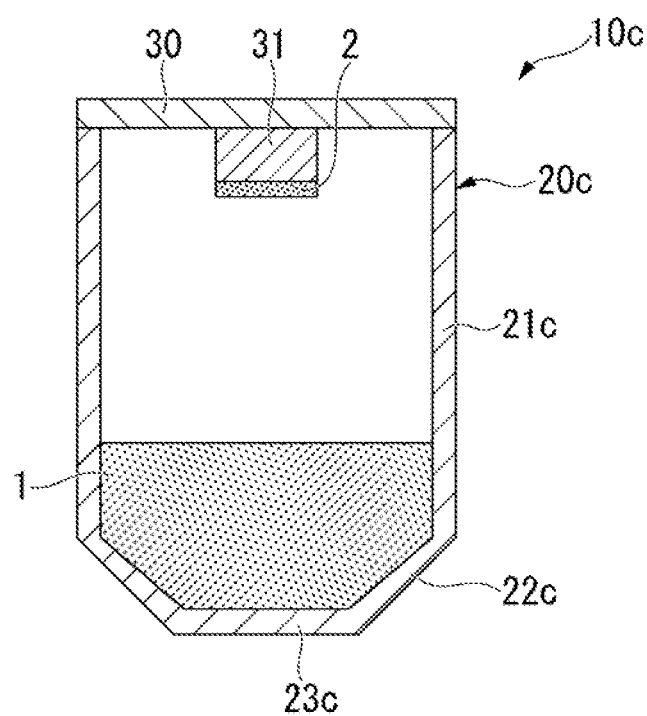
FIG. 4 is a schematic cross-sectional view showing another example of the SiC single crystal growth crucible according to one embodiment of the invention.

FIG. 4 is a schematic cross-sectional view showing another example of the SiC single crystal growth crucible according to one embodiment of the invention.

A SiC single crystal growth crucible 10c of the embodiment shown in FIG. 4 is different from the SiC single crystal growth crucible 10b of the embodiment, in that a raw material accommodation portion 20c includes a body portion 21c and a tapered portion 22c, and a bottom portion of the tapered portion 22c is a flat portion 23c, that is, the tapered portion 22c has a truncated conical shape. The same reference numerals are used for the common portions between the SiC single crystal growth crucible 10c of the embodiment and the SiC single crystal growth crucible 10b of the embodiment described above, and the description thereof will be omitted.

In the SiC single crystal growth crucible 10c, the bottom portion of the tapered portion 22c is the flat portion 23c, and accordingly, the self-standing can be performed. Therefore, the SiC single crystal growth crucible 10c can be installed in the SiC single crystal manufacturing apparatus, without using a support member.

Figure 5:
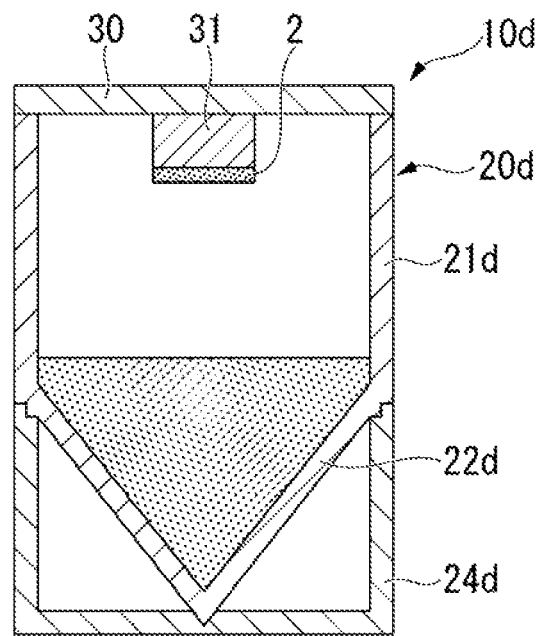
FIG. 5 is a schematic cross-sectional view showing still another example of the SiC single crystal growth crucible according to one embodiment of the invention.

FIG. 5 is a schematic cross-sectional view showing still another example of the SiC single crystal growth crucible according to one embodiment of the invention.

A SiC single crystal growth crucible 10d shown in FIG. 5 is different from the SiC single crystal growth crucible 10b of the embodiment described above, in that a raw material accommodation portion 20d includes a body portion 21d and a tapered portion 22d, and the tapered portion 22d is supported by a support member 24d. The same reference numerals are used for the common portions between the SiC single crystal growth crucible 10c of the embodiment and the SiC single crystal growth crucible 10b of the embodiment described above, and the description thereof will be omitted.

The support member 24d is a bottomed cylindrical body having an opening on the upper portion. A recess is formed in the center of the bottom portion of the support member 24d, and a tip of the tapered portion 22d of the SiC single crystal growth crucible 10d is inserted into the recess. As a material of the support member 24d, for example, a heat resistant material such as graphite, tantalum carbide, SiC can be used. It is possible to further increase stability, in a case where the SiC single crystal growth crucible 10c is installed in the SiC single crystal manufacturing apparatus, by using the support member 24d.

Figure 6:
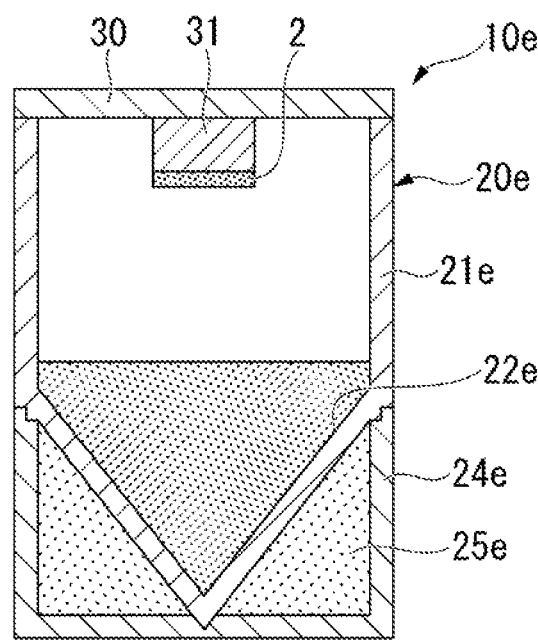
FIG. 6 is a schematic cross-sectional view showing still another example of the SiC single crystal growth crucible according to one embodiment of the invention.

FIG. 6 is a schematic cross-sectional view showing still another example of the SiC single crystal growth crucible according to one embodiment of the invention.

A SiC single crystal growth crucible 10e shown in FIG. 6 is different from the SiC single crystal growth crucible 10b of the embodiment described above, in that a raw material accommodation portion 20e includes a body portion 21e and a tapered portion 22e, and the tapered portion 22e is supported by a support member 24e filled with a thermal conductor 25e. The same reference numerals are used for the common portions between the SiC single crystal growth crucible 10e of the embodiment and the SiC single crystal growth crucible 10b of the embodiment described above, and the description thereof will be omitted.

The support member 24e is a bottomed cylindrical body in which an opening is filled with the thermal conductor 25e. The thermal conductor 25e is filled to come into contact with the outer surface of the tapered portion 22e of the SiC single crystal growth crucible 10e. As a material of the support member 24e and the thermal conductor 25e, for example, a heat resistant material such as graphite, tantalum carbide, SiC can be used. By filling the support member 24e with the thermal conductor 25e, a strength of the support member 24e is improved. Accordingly, the stability in a case where the SiC single crystal growth crucible 10e is installed in the SiC single crystal manufacturing apparatus is further increased. The thermal conductor 25e may be directly in contact with the SiC raw material 1.

Hereinabove, the embodiments of the invention have been described, but the invention is not limited to specific embodiments, and various modifications and changes can be performed within a range of the gist of the invention.

EXAMPLES

Example 1

Figure 7:
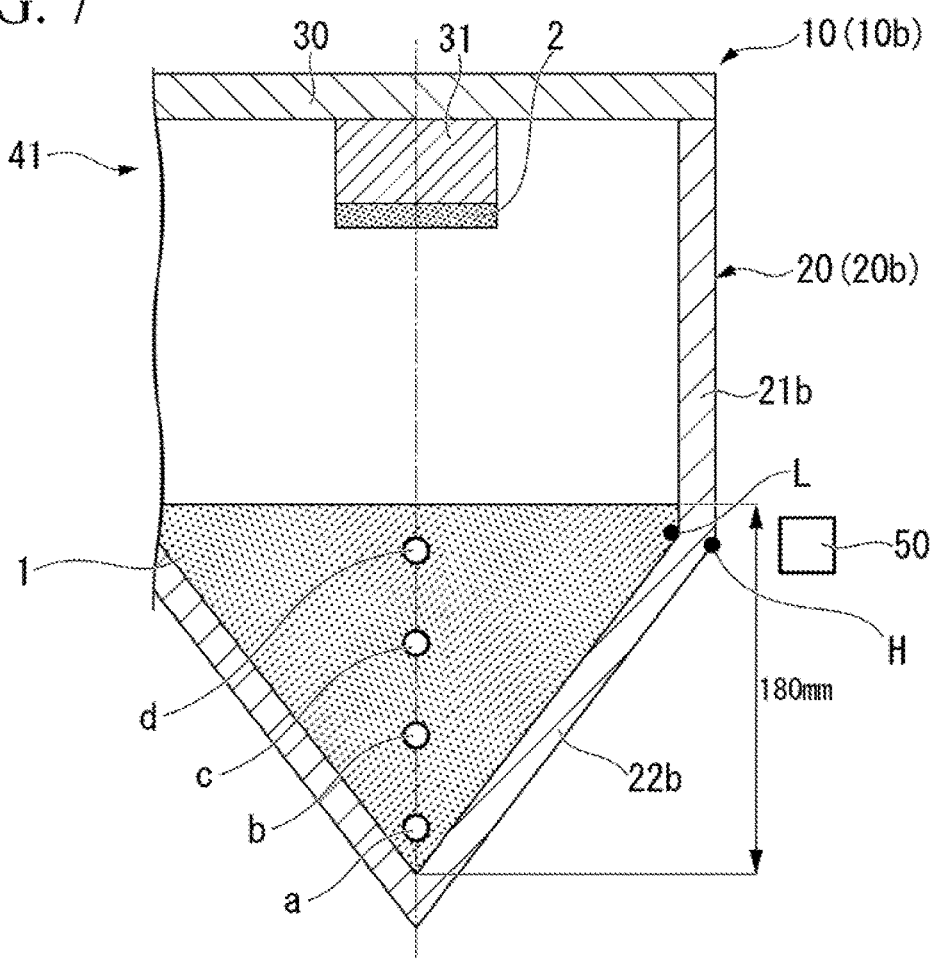
FIG. 7 is a schematic cross-sectional view showing a crystal growing device using a simulation of Example 1.

FIG. 7 is a schematic cross-sectional view showing a SiC crystal manufacturing apparatus using a simulation of Example 1.

A SiC single crystal manufacturing apparatus 41 includes the SiC single crystal growth crucible 10 and the heating device 50. The SiC single crystal manufacturing apparatus 41 has a symmetrical structure about a central axis of the SiC single crystal growth crucible 10. The SiC single crystal growth crucible 10 is the SiC single crystal growth crucible 10b shown in FIG. 2. A filing height of the SiC raw material 1 filled in the raw material accommodation portion 20b was set as 180 mm. A disposition position of the heating device 50 was a position where a height of the taper start position L of the tapered portion 22b is higher than the heating center H by 20 mm. That is, the heating center H is on a height position of 160 mm from the lowermost portion of the raw material.

The simulation was performed only with a structure of a half (half in a radial direction) of a random cross section passing the central axis of the raw material accommodation portion 20, in order to reduce a calculation load. In the simulation, crystal growth analysis software "Virtual Reactor" manufactured by STR-Group Ltd. was used. The simulation is widely used in a simulation of a temperature distribution in a furnace, and it is found that the simulation highly relates to the actual experimental result.

Figure 8:
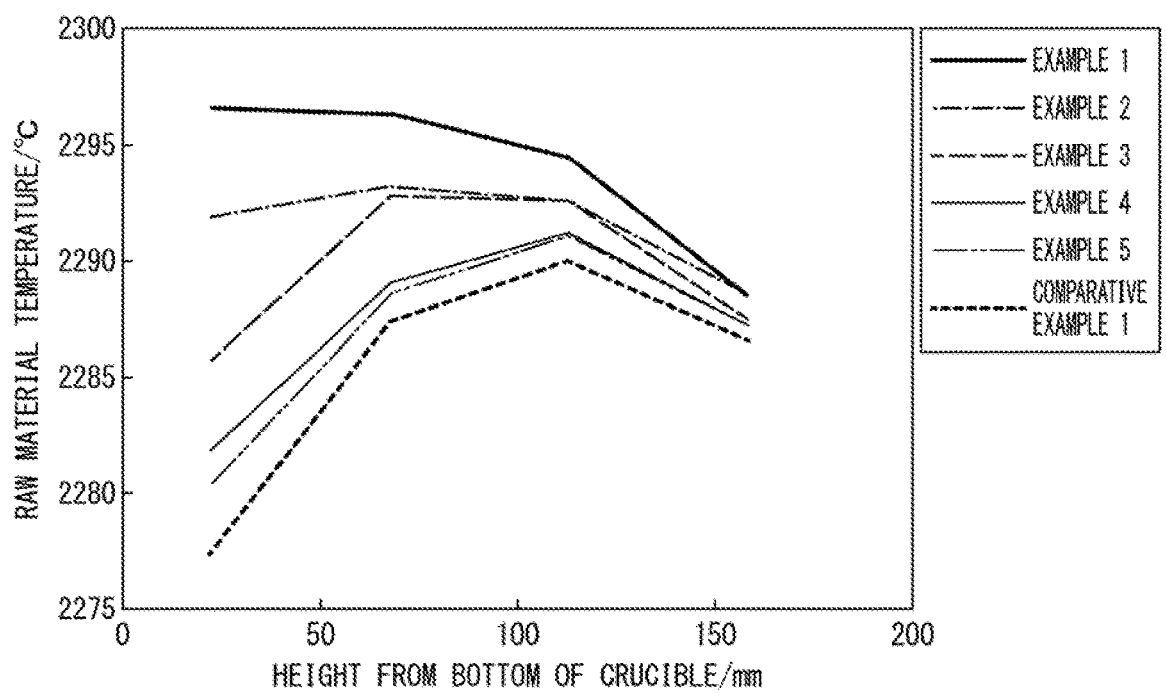
FIG. 8 is a graph showing a result of simulations of Examples 1 to 5 and Comparative Example 1.

As the temperature distribution, temperatures of the SiC raw material 1 at a position of 22.5 mm (a in FIG. 7), position of 67.5 mm (b in FIG. 7), position of 112.5 mm (c in FIG. 7), and position of 157.5 mm (d in FIG. 7) higher than the bottom portion of the central axis of the raw material accommodation portion 20 were obtained. The results thereof are shown in FIG. 8.

Example 2

The simulation was performed under the same conditions as in Example 1, except that the SiC single crystal growth crucible 10 was set as the SiC single crystal growth crucible 10c shown in FIG. 4. The results thereof are shown in FIG. 8.

Example 3

The simulation was performed under the same conditions as in Example 1, except that the SiC single crystal growth crucible 10 was set as the SiC single crystal growth crucible 10d shown in FIG. 5. The results thereof are shown in FIG. 8.

Example 4

The simulation was performed under the same conditions as in Example 1, except that the SiC single crystal growth crucible 10 was set as the SiC single crystal growth crucible 10e (material of the thermal conductor 25e: graphite) shown in FIG. 6. The results thereof are shown in FIG. 8.

Example 5

The simulation was performed under the same conditions as in Example 1, except that the SiC single crystal growth crucible 10 was set as the SiC single crystal growth crucible 10e (material of the thermal conductor 25e: SiC sintered body) shown in FIG. 6. The results thereof are shown in FIG. 8.

Comparative Example

The simulation was performed under the same conditions as in Example 1, except that the SiC single crystal growth crucible 10 was set as the SiC single crystal growth crucible 10a of the related art shown in FIG. 1. However, the disposition position of the heating device 50 was a position so that the heating center was at a height of 160 mm from the lowermost portion of the raw material, in the same manner as in Example 1. The results thereof are shown in FIG. 8.

From the result of FIG. 8, in all of the SiC single crystal growth crucibles 10b to 10e of Examples 1 to 5 in which the raw material accommodation portions 20b to 20e include the tapered portions 22b to 22e, it is found that, a temperature of the center of the SiC raw material 1 filled in the raw material accommodation portions 20b to 20e increases, compared to the SiC single crystal growth crucible 10a of Comparative Example 1 in which the raw material accommodation portion 20a is a bottomed cylindrical body. Particularly, in the SiC single crystal growth crucibles 10b and 10c of Examples 1 and 2 in which the outer surface of the tapered portions 22b and 22c face the heating device 50, it is found that the temperature of the center of the SiC raw material 1 further increases.

Example 6

Figure 9:
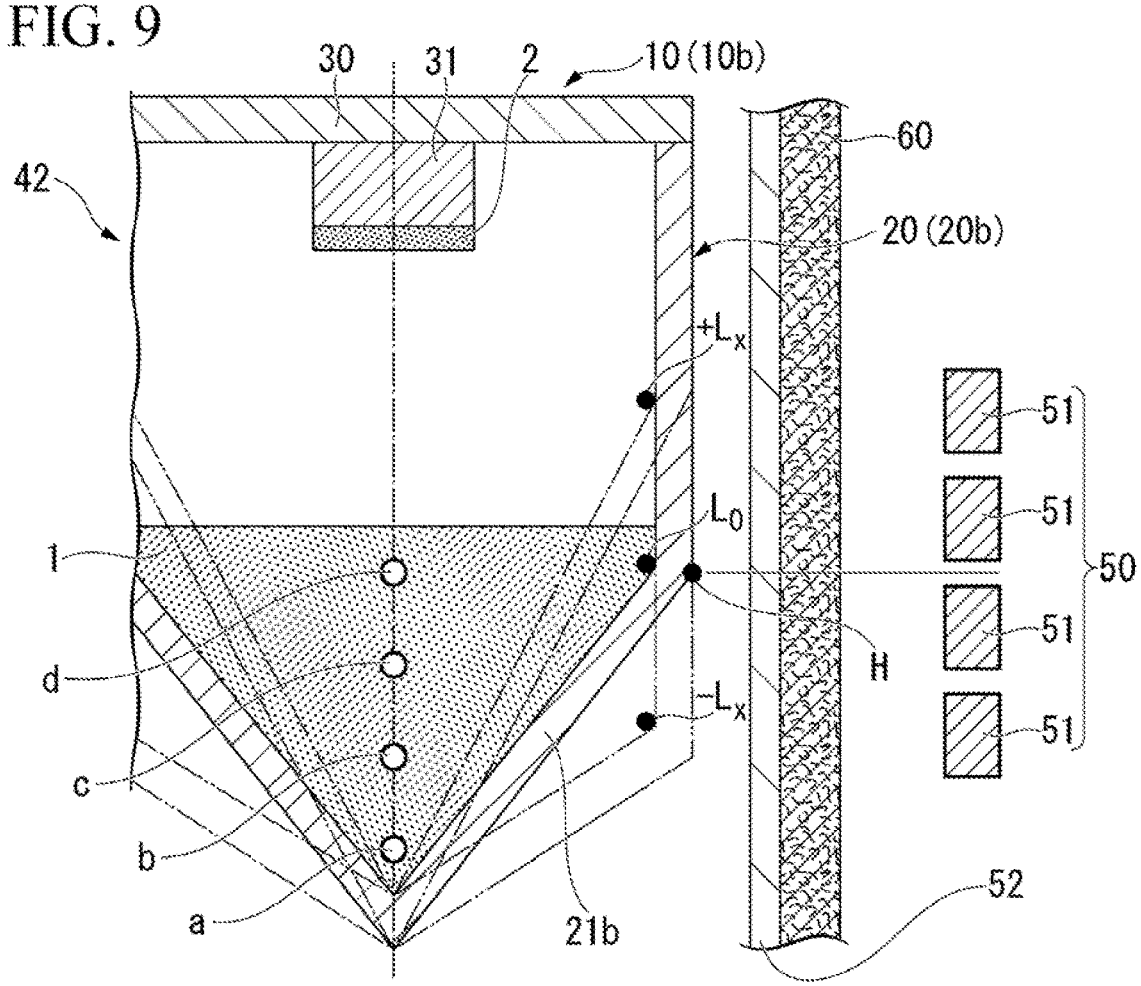
FIG. 9 is a schematic cross-sectional view showing a crystal growing device using a simulation of Example 6.

FIG. 9 is a schematic cross-sectional view showing the SiC single crystal manufacturing apparatus using a simulation of Example 6.

In FIG. 9, a SiC single crystal manufacturing apparatus 42 includes the SiC single crystal growth crucible 10, the heating device 50, and the heat insulating material 60. The heating device 50 is formed of a high frequency coil 51, and a heater 52 which generates heat by a magnetic field generated by the high frequency coil 51. The heat insulating material 60 is disposed between the high frequency coil 51 and the heater 52. The SiC single crystal manufacturing apparatus 42 has a symmetrical structure about a central axis of the SiC single crystal growth crucible 10. The SiC single crystal growth crucible 10 is the SiC single crystal growth crucible 10b shown in FIG. 2.

In Example 6, as shown in FIG. 9, the simulation of the temperature distribution of the SiC raw material 1 filled in the raw material accommodation portion 20b, in a case where the height of the taper start position L of the tapered portion 22b of the SiC single crystal growth crucible 10b was changed, was performed. The height of the taper start position L of the tapered portion 22b with respect to the heating center H was set as x, a case where the position of the taper start position L is higher than the heating center H was set as positive (+), and the simulation of the temperature distribution of the SiC raw material 1, in a case where x=−60 mm to +60 mm, was performed. The heating center H was a portion in contact with the center of the high frequency coil in a vertical direction. In addition, the filling height of the SiC raw material 1 filled in the raw material accommodation portion 20b was set as 180 mm.

In the simulation, crystal growth analysis software "Virtual Reactor" manufactured by STR-Group Ltd. was used. As the temperature distribution, temperatures at a position of 22.5 mm (a in FIG. 7), position of 67.5 mm (b in FIG. 7), position of 112.5 mm (c in FIG. 7), and position of 157.5 mm (d in FIG. 7) higher than the bottom portion of the central axis of the raw material accommodation portion 20 were obtained. The result thereof is shown in FIG. 10 with the result of Comparative Example 1.

Figure 10:
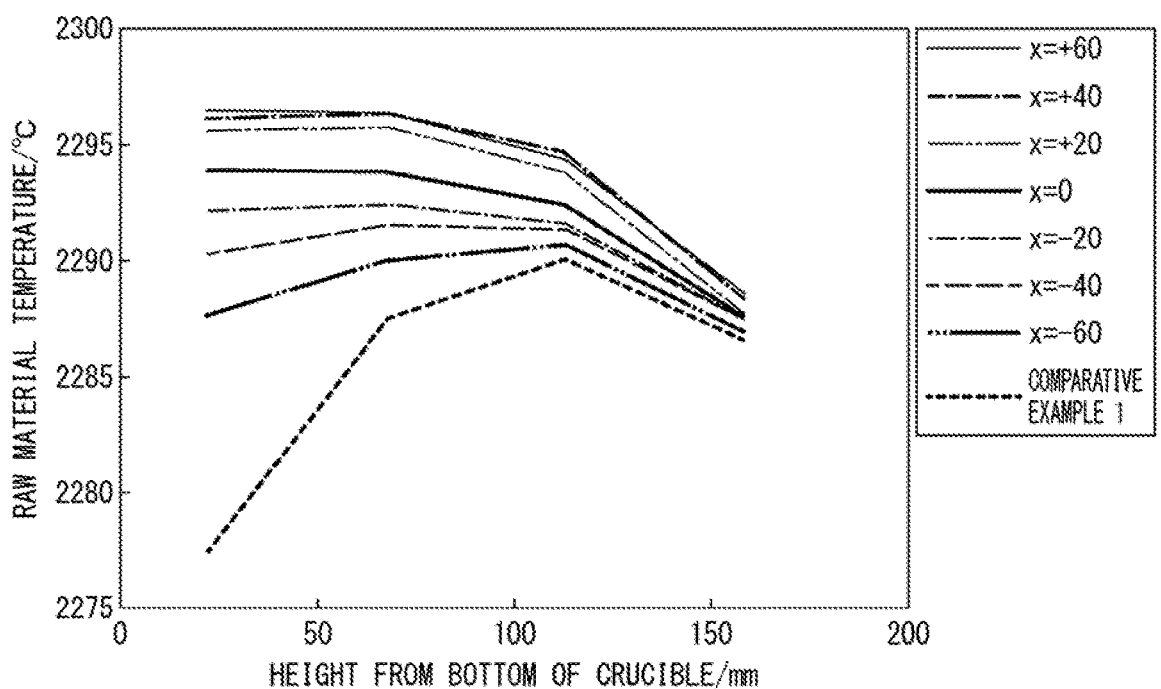
FIG. 10 is a graph showing a result of a simulation of Example 6.

From the result of FIG. 10, in a case where the height x of the taper start position L of the tapered portion 22b with respect to the heating center H is 0 mm to +60 mm (in a case where the heating center H is positioned in a range of the tapered portion 22b), it is found that the temperature of the center of the SiC raw material 1 filled in the raw material accommodation portion 20b increases, compared to a case where the height is −20 to −60 mm.

EXPLANATION OF REFERENCES

1: SiC raw material
2: seed crystal
10, 10a, 10b, 10c, 10e: SiC single crystal growth crucible
20, 20a, 20b, 20c, 20e: raw material accommodation portion
21b, 21c, 21e: body portion
22b, 22c, 22e: tapered portion
23c: flat portion
24d, 24e: support member
25e: thermal conductor
30: lid portion
31: seed crystal support portion
40, 41, 42: SiC single crystal manufacturing apparatus
50: heating device
51: high frequency coil
52: heater
60: heat insulating material

What is claimed is:

1. A SiC single crystal growth crucible comprising:
a raw material accommodation portion which accommodates a SiC raw material; and
a seed crystal support portion which supports a seed crystal disposed on an upper portion of the raw material accommodation portion,
wherein the raw material accommodation portion has a body portion on an upper side and a tapered portion on a lower side,
an inner surface of the body portion has a constant width,
an inner surface of the tapered portion is tapered off downward,
a bottom portion of the raw material accommodation portion is a bottom of the SiC single crystal growth crucible,
the tapered portion has a conical shape which is continuously and linearly tapered off, and
an outer surface of the tapered portion of the raw material accommodation portion is tapered off downward.

2. A SiC single crystal manufacturing apparatus comprising:
the SiC single crystal growth crucible according to claim 1; and
a heating device which heats the SiC single crystal growth crucible,
wherein the heating device is disposed such that a heating center is positioned in a range of the tapered portion of the raw material accommodation portion.

3. The SiC single crystal manufacturing apparatus according to claim 2,
wherein the heating center is a portion of an outer surface of the raw material accommodation portion where quantity of heat transmitted from the heating device is the greatest, and
a height of a taper start position of the tapered portion with respect to the heating center is 60 mm or less.

4. The SiC single crystal growth crucible according to claim 1, wherein the raw material accommodation portion is made of graphite or tantalum carbide.

5. The SiC single crystal growth crucible according to claim 1,
wherein a side wall of the body portion is symmetrical with respect to a central axis of the raw material accommodation portion, and a side wall of the tapered portion is symmetrical with respect to the central axis of the raw material accommodation portion.

6. The SiC single crystal growth crucible according to claim 1,
wherein the body portion and the tapered portion are continuum.

* * * * *